US007166168B1

(12) United States Patent
Heller et al.

(10) Patent No.: US 7,166,168 B1
(45) Date of Patent: Jan. 23, 2007

(54) SUBSTRATE-COATING SYSTEM AND AN ASSOCIATED SUBSTRATE-HEATING METHOD (75) Inventors: Matthias Heller, Hohenahr (DE); Gean Jack Hsu, Wetzlar (DE); Frank Michel, Braunfels (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/120,195

(22) Filed: May 3, 2005

Related U.S. Application Data (63) Continuation of application No. 10/687,870, filed on Oct. 20, 2003, now abandoned.

(60) Provisional application No. 60/419,095, filed on Oct. 18, 2002.

(51) Int. Cl.
*C23C 14/00* (2006.01)

(52) U.S. Cl. .................. 118/725; 118/666; 118/728; 118/730

(58) Field of Classification Search ............... 118/725, 118/728, 730, 641, 666
See application file for complete search history.

(56) References Cited

U.S. PATENT DOCUMENTS

| 2,532,971 | A |   | 12/1950 | Van Leer et al. |        |
|-----------|---|---|---------|-----------------|--------|
| 2,610,606 | A |   | 9/1952  | Weber et al.    |        |
| 3,632,439 | A |   | 1/1972  | Deklerk         |        |
| 3,783,822 | A |   | 1/1974  | Wollam          |        |
| 4,961,399 | A |   | 10/1990 | Frijlink        |        |
| 5,108,792 | A |   | 4/1992  | Anderson et al. |        |
| 5,133,286 | A |   | 7/1992  | Choo et al.     |        |
| 5,332,442 | A | * | 7/1994  | Kubodera et al. | 118/725 |
| 5,367,606 | A |   | 11/1994 | Moslehi et al.  |        |
| 5,474,612 | A | * | 12/1995 | Sato et al.     | 118/725 |
| 5,551,982 | A |   | 9/1996  | Anderson et al. |        |
| 5,592,581 | A |   | 1/1997  | Okase           |        |
| 5,683,518 | A |   | 11/1997 | Moore et al.    |        |

(Continued)

FOREIGN PATENT DOCUMENTS

WO    WO 00/00445 A1    1/2000

OTHER PUBLICATIONS

Webster's New World Dictionary, The World Publishing Co., 1968, pp. 9 and 1057.*

*Primary Examiner*—Richard Bueker
(74) *Attorney, Agent, or Firm*—Sughrue Mion, PLLC (57) ABSTRACT A substrate-coating system and an associated substrate-heating method, wherein the substrate-coating system is equipped with a substrate holder (1, 2) for holding at least one substrate at a coating position where it is coated on a coating side, and with a substrate heater (5, 6). The method includes heating at least one substrate that has been brought into such a system while it is being coated. The substrate heater includes a backside heater (6) for actively heating the substrate from its backside, i.e., that side opposite the side to be coated, while it is at its coating position. A heat-conducting element that is brought into thermal contact with a surface of the substrate may also be provided. Heater power is then regulated, based on the difference between the actual substrate temperature and a preset, desired, substrate temperature, and thereby limited such that the temperature of the heat-conducting element will not excessively increase over that of the substrate. The system and method are particularly applicable, e.g., to coating optical components fabricated from $CaF_2$.

11 Claims, 3 Drawing Sheets

U.S. PATENT DOCUMENTS

| | | |
|---|---|---|
| 5,803,975 A | 9/1998 | Suzuki |
| 5,880,437 A * | 3/1999 | Kasai et al. ................. 392/416 |
| 5,930,456 A * | 7/1999 | Vosen ......................... 392/416 |
| 6,124,793 A * | 9/2000 | Knutson ...................... 340/584 |
| 6,222,990 B1 * | 4/2001 | Guardado et al. ........... 392/416 |
| 2002/0030042 A1 | 3/2002 | Ullmann et al. |
| 2002/0113971 A1 | 8/2002 | Zettler et al. |

* cited by examiner

SUBSTRATE-COATING SYSTEM AND AN ASSOCIATED SUBSTRATE-HEATING METHOD

This is a Continuation of application Ser. No. 10/687,870 filed Oct. 20, 2003 now abandoned, and which is hereby incorporated by reference. The disclosure is based also on U.S. Provisional application No. 60/419,095, filed Oct. 18, 2002.

FIELD OF AND BACKGROUND OF THE INVENTION

The invention relates to a substrate-coating system equipped with a substrate holder for holding at least one substrate at a coating position where it is coated on a coating side, a substrate heater, and a method for heating that at least one substrate during coating.

Substrate coating systems of that type are generally known and are used for, for example, depositing functional and/or protective coatings on optical components. Heating substrates during coating will frequently allow improving the properties of the coatings deposited. In the case of optical coatings, substrate temperatures of, e.g., about 300° C., are typical.

IR thermal radiators whose peak emission wavelengths range from 2 µm to 6 µm, depending up the type of thermal-radiation source employed, are usually employed for heating substrates. However, this type of thermal-radiation heating of substrates presents problems if the substrate material only weakly absorbs in that wavelength range, which is particularly true for calcium-fluoride (CaF2) substrates, and thus also for commonly employed optical components, such as lenses, fabricated from that material. Employing IR thermal radiators to heat such substrates is particularly ineffective and involves long heating periods if the thermal radiators are arranged at a relatively large distance from that side of the substrates that is to be coated in order not to shield that side of the substrates and thereby interfere with the transport of coating material from a coating source to that side of the substrates. Another problem that occurs in the case of $CaF_2$-substrates is the comparatively large coefficient of thermal expansion of $CaF_2$, which requires carrying out heating and cooling-down cycles sufficiently gently that cracking due to thermally induced mechanical stresses will be avoided.

Laid-open publication DE 100 45 264 A1 proposed employing thermal-radiation generators that emit at wavelengths longer than 9 µm for heating workpieces, particularly such consisting of $CaF_2$-substrates. Specifically, employment of a $CO_2$-laser having an emission wavelength of 10.6 µm was proposed.

Laid-open publication WO 00/00445 A1 describes a method for thermally conditioning glass substrates prior to a subsequent surface treatment and an associated, evacuatable, heating chamber. The thermal-conditioning process is the only process that takes place in that chamber. Substrates are brought to another, separate, chamber for the subsequent surface treatment, which might involve, e.g., vacuum coating the substrates. Within the heating chamber, substrates are mounted on a substrate holder and irradiated from one side with thermal radiation at wavelengths that preferably range from 1.5 µm to 6 µm emitted by one or more heat lamps. A reflector is arranged on the inner wall of the heating chamber, at least on that side thereof opposite the substrates, preferably on all sides thereof, at a distance from the substrates specifically in order to reflect thermal radiation transmitted through the substrates back to the substrates and thereby to provide a certain, passive, heating effect on the other sides of substrates, i.e., those opposite the heat lamp or lamps, which is regarded as preferable to an alternative where substrates are actively irradiated from both sides by suitable heat lamps. The heating chamber, which is specifically designed for thermally conditioning substrates, in particular, flat glass substrates, is not suited to simultaneously serving as the chamber to be employed for the subsequent surface treatment of substrates, such as coating substrates, due to its design.

OBJECTS OF THE INVENTION

The invention addresses the problem of engineering a substrate-heating system of the type mentioned at the outset hereof and devising an associated substrate-heating method that will allow substrates to be gently and uniformly heated at the place where they are coated, without risking that cracking will occur, and that is also particularly well-suited to heating optical components and other substrates fabricated from calcium fluoride during coating.

SUMMARY OF THE INVENTION

The invention solves that problem by providing a substrate-coating system having a substrate holder for holding at least one substrate at a coating position where it will be coated on a coating side, and a substrate heater, wherein the substrate heater includes a backside heater for actively heating the substrate from a backside opposite the coating side thereof, while the substrate is at its coating position.

The invention also provides a method for heating substrates which includes the steps of detecting the temperature of the substrate and of a heat-conducting element abutting against the substrate or a substrate-carrier fixture that is in thermal contact with the substrate; regulating the heating power of the substrate heater in accordance with the difference between the detected actual substrate temperature and a preset, desired, substrate temperature; and limiting that heating power such that the detected temperature of the heat-conducting element or substrate-carrier fixture will not exceed a maximum temperature that exceeds the detected substrate temperature by a preset difference.

The invention further provides a method which includes the steps of detecting the temperature of the substrate and of a heat-conducting element abutting against the substrate or a substrate-carrier fixture that is in thermal contact with the substrate; and regulating and/or limiting the heating power of the substrate heater in accordance with the difference between the actual substrate temperature and a selectable desired value of an offset of the substrate temperature with respect to the temperature of the heat-conducting element or substrate-carrier fixture.

In the case of the substrate-coating system according to the invention, its substrate heater includes a backside heater for actively heating the substrates from their backside, i.e., their side opposite the side to be coated, while they are at their respective coating positions. Since no space on this substrate side opposite that to be coated need be left unobstructed for the transport of coating material from a coating source to the substrate, there is more freedom for designing and laying out the backside heater than in the case of front-side heaters, i.e. heaters that face the side to be coated. In particular, the backside heater may be positioned relatively close to the substrates and have a shape that is adapted to optimally suit the application involved. For otherwise identical conditions, the heater power transferable to the substrates increases with the inverse square of the distance between heater and substrate. All considered the backside heating thus provides highly effective, uniform, gentle substrate heating.

The short distance between the backside heater and the substrate also allows heating the substrate at relatively low surface temperatures or temperatures of the heating elements employed, which, to this end, may be operated at heating powers less than their maximum heating power, which avoids undesirable emissions of contaminants from heating elements and unfavorable shifts of their spectral-intensity maximum to shorter wavelengths in accordance with Wien's displacement law.

A benefit of an improved embodiment of the invention, in which the substrate heater also incorporates a front-side heater, is that it supports backside heating via a front-side heating that acts on the substrate side to be coated. This can contribute to more uniform substrate heating.

Under a beneficial improved embodiment of the invention, the substrate holder incorporates at least one substrate carrier that is transparent to thermal radiation emitted by the backside heater over at least portions thereof, which may be implemented by, e.g., choosing a substrate-carrier material that is transparent to that thermal radiation or by providing window-like openings in the substrate carrier in the event that it is fabricated from a material that is opaque to that thermal radiation. Those openings may be covered with transparent window coatings, if necessary. Its backside heater has one or more heating elements arranged on that side of substrate carrier opposite that which faces the substrate to be coated, which will allow directing thermal radiation emitted by the heating element or elements through the transparent areas of the substrate carrier and onto the substrate without incurring major losses and without unnecessary, excessive, heating of the substrate carrier.

In conjunction with implementing this measure, in accordance with a further preferred embodiment, the heating elements are configured in the form of IR thermal radiators and the areas of substrate carrier that are transparent to their thermal radiation are implemented in the form of window layers fabricated from a suitable material. A further configuration thereof involves antireflection coating one, or both, sides of those windows layers for a wavelength range that both covers a major portion of the thermal radiation emitted by the IR thermal radiator or radiators and within which the substrate material markedly absorbs thermal radiation. In the case of $CaF_2$-substrates, that wavelength range might be, e.g., 10 µm to 12 µm.

An improved embodiment of the invention provides a heat-transfer barrier that enclose the substrate like a hood during cooling-down periods, which allows particularly gentle cooling processes with a comparatively slow temperature decrease, which will keep mechanical stressing of the substrate low.

An improved embodiment of a substrate-coating system contains a so-called planetary system having a rotary substrate holder that has several planetary substrate carriers that are free to rotate about a central axis. In keeping therewith, the backside heater is configured in the form of a closed or open heat-radiator ring with which substrates may be simultaneously, uniformly, heated. In conjunction with an implementation in which the backside heater is configured in the form of an open ring, a pyrometer for temperature detection is mounted within its ring gap.

In the case of a further beneficial embodiment of the invention the substrate-coating system includes a heat-conducting element that can be abutted against the substrate with two-dimensional contact. This heat-conducting element is configured such that it has relatively high absorption within the spectral emission range of the heating elements employed and thus aids the heating of the substrate by absorbing thermal energy and transferring it to the substrate over a contact surface that is chosen to be as large as feasible, where it will be beneficial if the contact surface acting as heat-transfer surface is chosen such that temperature gradients within the substrate will be maintained as small as possible during heating, without obstructing the side of the substrate that is to be coated or damaging sensitive substrate surfaces.

In conjunction with implementing this measure, in accordance with a further preferred embodiment, this heat-conducting element forms part of the substrate holder. In conjunction with its further implementation, means for elastically pressing the heat-conducting element against the substrate may be provided in order to provide reliable thermal contact between them.

Heating of substrates that have been brought into such a coating system may, in particular, be by means of the methods in accordance with the invention, wherein the temperatures of the substrates and the heat-conducting element or substrate-carrier fixture are detected and employed for regulating and suitably limiting heating power, as well as, if necessary, other input parameters, based on the detected temperatures.

Under one of these methods, substrate temperature is regulated at a preset temperature and heating power is limited such that the detected temperature of the associated heat-conducting element or substrate-carrier fixture will not exceed a maximum value that is higher than the detected substrate temperature by a prescribable temperature difference. Under the other method, regulation is based on a selectable, preset, offset value between the substrate temperature and the temperature of the heat-conducting element or substrate-carrier fixture, which will also provide for limiting the regulated heating power such that excessive differences between the substrate temperature and the temperature of the associated heat-conducting element or substrate-carrier fixture will be avoided.

Both types of heating thus reliably avoid occurrences of excessive mechanical stressing of substrates, even in cases where the heat-conducting element or substrate-carrier fixture has higher absorption for the short-wavelength portion of the thermal radiation involved and thus heat up much more rapidly than the substrate.

BRIEF DESCRIPTION OF THE DRAWINGS

Beneficial embodiments of the invention are depicted in the accompanying figures and shall be described below. The accompanying figures depict.

DETAILED DESCRIPTION OF THE PREFERRED EMBODIMENTS

Figure 1:
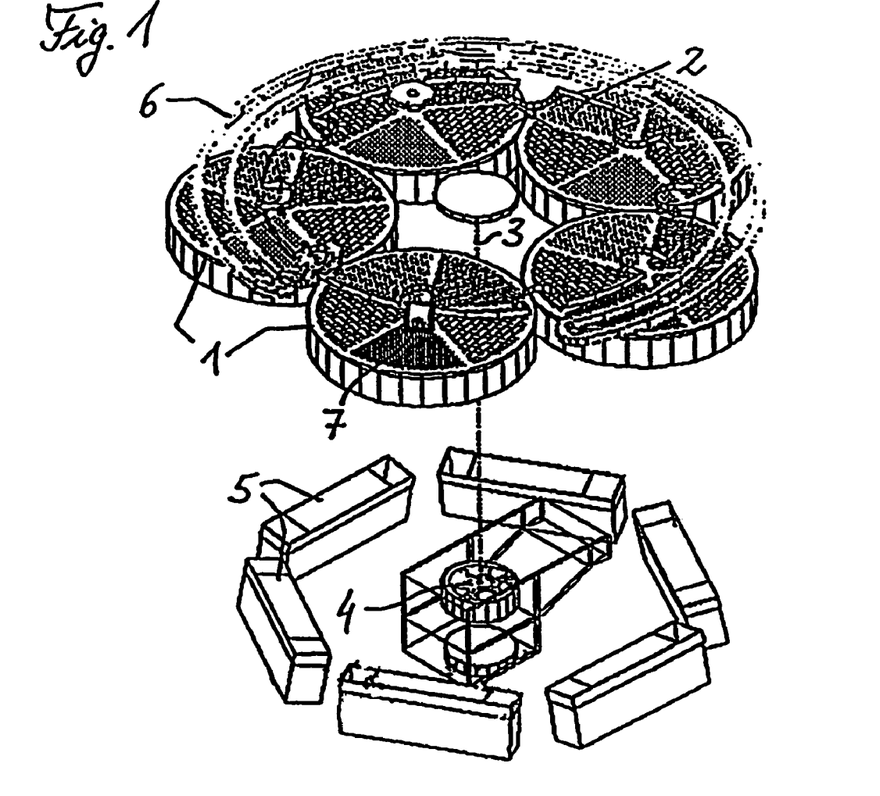
FIG. 1 a schematized perspective view of a planetary system of a substrate-coating system equipped with front-side and backside heaters.

FIG. 1 depicts, in accordance with the invention, a part of a substrate-coating system with which optical components, as well as other types of substrates, may be coated in desired manners. For example, desired coatings, such as multilayer stacks of oxides and fluorides having suitable film thicknesses, may be deposited on, e.g., lenses and other types of optical components, by evaporation at suitable substrate temperatures in order to obtain coatings complying with prescribed sets of specifications regarding their optical properties, environmental aspects, resistance to radiation damage, adhesion to substrates, and resistance to chemical attack.

In particular, that part thereof depicted in FIG. 1 has a conventional so-called planetary system, upon which five circular, pan-shaped, substrate carriers 1 whose open ends face downward, each of which has an evaporation ring 18 as a substrate-carrier fixture, are mounted in a conventional manner, which has not been depicted in any detail, around the circumference of a holder disk 2 such that they are free to rotate about their respective central axes, all of which pass through the circumference of a common circle. This holder disk 2 is mounted such that it is free to rotate about its central axis 3. A conventional coating source 4 is emplaced beneath this arrangement of substrate carriers, at a distance therefrom.

The desired coating may then be highly uniformly deposited on that side of substrates that have been inserted into the substrate carriers 1 that faces the coating source 4, which shall hereinafter be referred to as their "front side" or "side to be coated," by rotating both the individual substrate carriers 1 and the holder disk 2.

Front-side and backside heaters 5, 6 are provided for heating substrates. The front-side heater consists of six IR thermal radiators 5, e.g., so-called "Richmont" radiators having heating powers of 2 kW each, equidistantly spaced about the coating source 4. The backside heater includes an open IR heat-radiator ring 6 that is arranged above, and radially outside, the holder disk 2, but within the outer perimeter of the substrate carriers 1. This heat-radiator ring 6 is rigidly attached to the housing of a conventional coating chamber, within which that part of the system depicted in FIG. 1 is situated, in a manner that will not be further described here. A pyrometer 7 that serves to detect substrate temperature and is only schematically indicated in FIG. 1 is installed within the ring gap of the heat-radiator ring 6. In order that measurements of substrate temperature will not be falsified by thermal radiation coming directly from the thermal-radiator ring 6, the gap of that ring is chosen sufficiently large and the pyrometer 7 is positioned approximately at the center of the gap. The pyrometer is preferably designed to have a suitable cutoff wavelength of, e.g., 8 µm.

The two-sided substrate-heating system configured in this manner, and, particularly, the backside heating, has major advantages over conventional heating systems with front-side heating only, particularly in the case of substrates fabricated from calcium fluoride. Contrary to the case of, e.g., $SiO_2$-substrates, in the case of $CaF_2$-substrates, the spectral range over which they exhibit high absorption overlaps the spectral range over which typical IR heat radiators emit thermal radiation only relatively slightly, since the emission maxima of such heat radiators typically range from 2 µm to 6 µm, while the absorptance of calcium fluoride does not start to significantly increase until about 7 µm and reaches a maximum at about 12 µm.

Consequentially, heating only the front sides of $CaF_2$-substrates is comparatively ineffective, since front-side heaters, such as the front-side heating elements 5 depicted in FIG. 1, must be arranged relatively far away from substrates in order that they will not shield that side of substrates that is to be coated from the material to be deposited thereon, e.g., from a beam of vaporized material emitted by the coating source 4. On the other hand, the energy density per unit area of the thermal radiation emitted by the heaters, and thus the maximum quantity of heat that may be absorbed by each substrate involved, decreases with the square of the distance of the heaters from the substrates. Increasing heater power shifts their emission maximum to shorter wavelengths and thus reduces further the overlap of the spectral range over which the heaters emit thermal radiation with the spectral range over which calcium fluoride absorbs. Increasing heater power also increases the surface temperatures of the heating elements employed and thus the likelihood that undesirable contaminants will be emitted.

These difficulties may be avoided by employing the additional backside heater 6, as depicted in FIG. 1. Since no problems related to shielding of the coating material to be deposited arise when backside heating is employed, the backside heater 6 may be positioned very close to the substrate carriers 1, and thus very close to the backsides of substrates, e.g., at distances as short as about 50 mm to 100 mm from substrates. If an IR heat-radiator ring 6 having a heating power of 4 kW were employed, its heating efficiency would be, e.g., around 25 times that of typical front-side heaters with a heating power of 12 kW situated at a distance of 700 mm from substrates. The greater heating power reaching substrates allows switching substrate heaters to regulated operation earlier and operating them at much lower surface temperatures, which means that the extents to which their emission maxima will be shifted to shorter wavelengths will be less.

Figure 2:
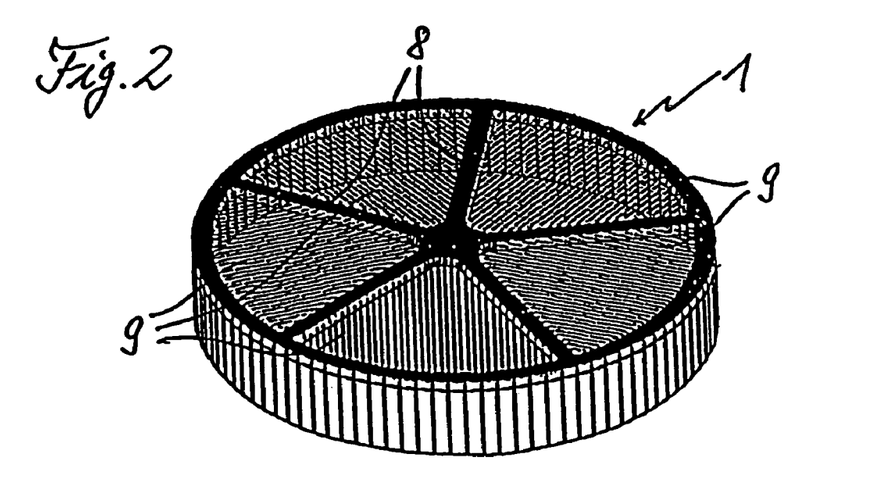
FIG. 2 a perspective view of a substrate carrier employed on the planetary system depicted in FIG. 1.

In order that as much as possible of the heating power radiated by the backside heating ring 6 will be transmitted through the substrate carriers 1 to the substrates without unnecessary excessive heating of the substrate carriers 1, the latter are designed such that they are highly transparent to a significant portion of the thermal radiation involved over at least portions of their surfaces. A beneficial implementation is illustrated in FIG. 2. In this particular case, the substrate carrier 1, which has an open bottom, is subdivided at its top back surface into five segments that have window layers 9 that are transparent to IR-radiation by five, circumferentially equidistantly spaced spokes 8. Suitable materials for those window layers 9 are, e.g., Ge, ZnSe, ZnS, or Si, as well as arbitrary combinations thereof, where Ge will be particularly beneficial, in view of its broadband transparency and high durability. These window layers 9 are antireflection-coated on one side or, preferably, both sides for the relevant wavelength range, within which the substrates, i.e., in the case of $CaF_2$-substrates, the wavelength range extending from about 10 µm to about 12 µm, markedly absorb thermal radiation transiting the window layers 9. Antireflection coating these window layers 9 will cause their transmittance over that wavelength range to reach, for example, around 90%. They may also be antireflection-coated for some other wavelength range in order to provide window areas having high transmittances for IR-radiation, in general, for wavelengths less than 20 μm, if demanded by the particular application involved.

This segmenting of the backsides of substrate carriers into the window areas 9 that are transparent to IR-radiation also has the advantage that the substrate carriers 1 will not be so strongly heated by thermal radiation emitted by the neighboring IR-heating ring 6 as would be the case if conventional, pan-shaped, substrate carriers configured in the form of solid-walled, stainless-steel, enclosures were employed. The heating power of the backside heating ring 6 is thus largely available for directly heating substrates.

In the case of alternative embodiments, this, at least, partly transparent configuration of the backsides of substrate carriers 1, which allows effective utilization of the heating effects of the backside heater 6, might consist of fabricating the substrate carriers 1 as a whole from a material that is transparent to IR-radiation, or even providing them with the aforementioned, segmented, apertures, but leaving the latter open, instead of covering them with window layers. The latter type of substrate carriers is primarily of interest in the case of applications where no disturbing contamination of the backsides of substrates by, e.g., particles abraded off the planetary-drive system, which may otherwise be prevented by covering their apertures with the window layers, are to be expected. The major parameters affecting the choice of material to be employed for fabricating substrate carriers are their mechanical rigidity, their specific heat capacity, and their specific gravity. Materials that have smaller specific gravity-specific heat capacity products will store less thermal energy during heating phases and drain off less thermal energy from substrates during cooling phases, which will allow a better regulation of substrate temperature.

Figure 3:
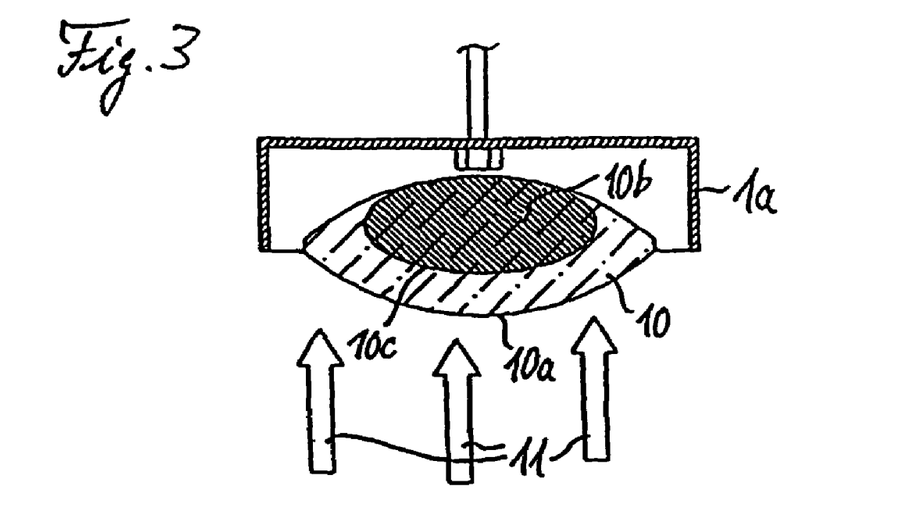
FIGS. 3 & 4 sectioned views of a conventional substrate carrier and a substrate carrier in accordance with the invention of the type depicted in FIG. 2, respectively, for the purpose of illustrating the differences between the heating effect on a biconvex-lens substrate for the case of a conventional system equipped with a front-side heater only and the case of a system in accordance with the invention equipped with both front-side and backside heaters.
Figure 4:
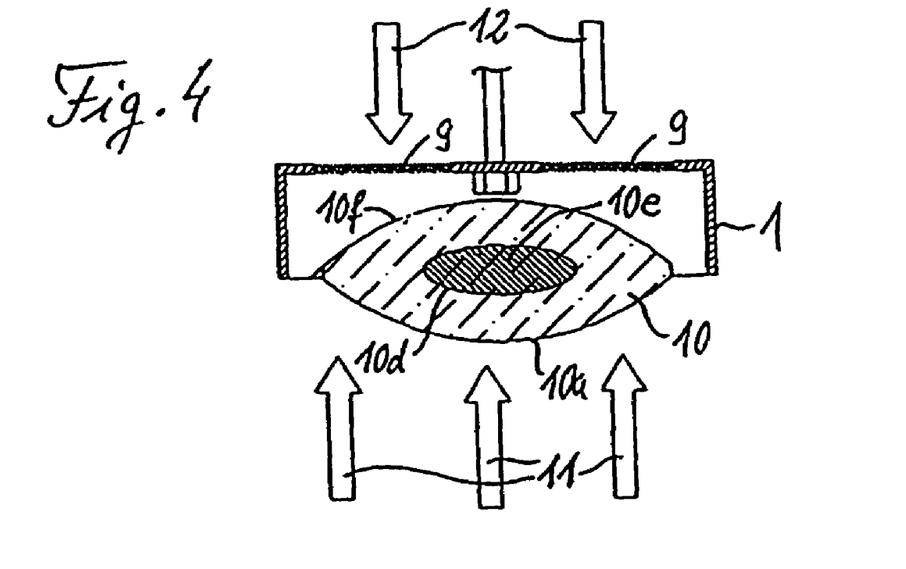

Combining a front-side heater 5 and a backside heater 6 thus allows highly uniformly coupling thermal energy into all sides of substrates, which prevents occurrences of undesirably high thermal and mechanical stress gradients within substrates, while keeping the surface temperatures of the IR thermal radiators 5, 6 employed comparatively low, which will minimize the shifts in their peak spectral intensities toward shorter wavelengths. FIGS. 3 and 4 schematically compare the beneficial heating effect obtainable by employing the invention to that obtained employing a conventional mode of heating, based on the example of a biconvex lens 10. FIG. 3 depicts a schematized sectioned view of a conventional case where the biconvex lens 10 is held in place by a solid-walled, pan-shaped, metallic, substrate carrier 1a that has an open bottom in order to allow coating its front or bottom side 10a. During coating, the biconvex-lens substrate 10 is heated by thermal radiation 11 from a front-side heater only that is situated at a relatively large distance therefrom, which causes relatively nonuniform heating of the substrate 10, under which it will be heated much less, or at a much slower rate at its back portion. This effect may be seen from the isothermal surface 10c that is situated very far to the rear of the substrate separating a cross-hatched, cooler, substrate core 10b from the rest of the substrate's, hotter, volume, as schematically indicated in FIG. 3.

For comparison, FIG. 4 depicts the case of heating the biconvex lens 10 to be coated in accordance with the invention, where the biconvex lens is held in place within a coating system according to FIG. 1 by a substrate carrier 1 according to FIG. 2. In this particular case, in addition to the front side of the biconvex lens 10 being irradiated by thermal radiation 11 from the front-side heater 5, its backside is also actively heated by thermal radiation 12 from the backside heat-radiator ring 6 through the windows 9 in the substrate carrier 1 that are transparent to IR-radiation. This yields a uniform heating of the substrate 10, from, effectively, all sides, which is reflected in the fact that the isothermal surfaces are essentially equidistant from its surfaces, i.e., from both its front surface 10a, i.e., the surface that is to be coated, and its rear surface 10f, which, in FIG. 4, is schematically indicated by an isothermal surface 10d that separates a cooler, inner, centrally located, substrate core 10e from the rest of the substrate's volume.

Figure 5:
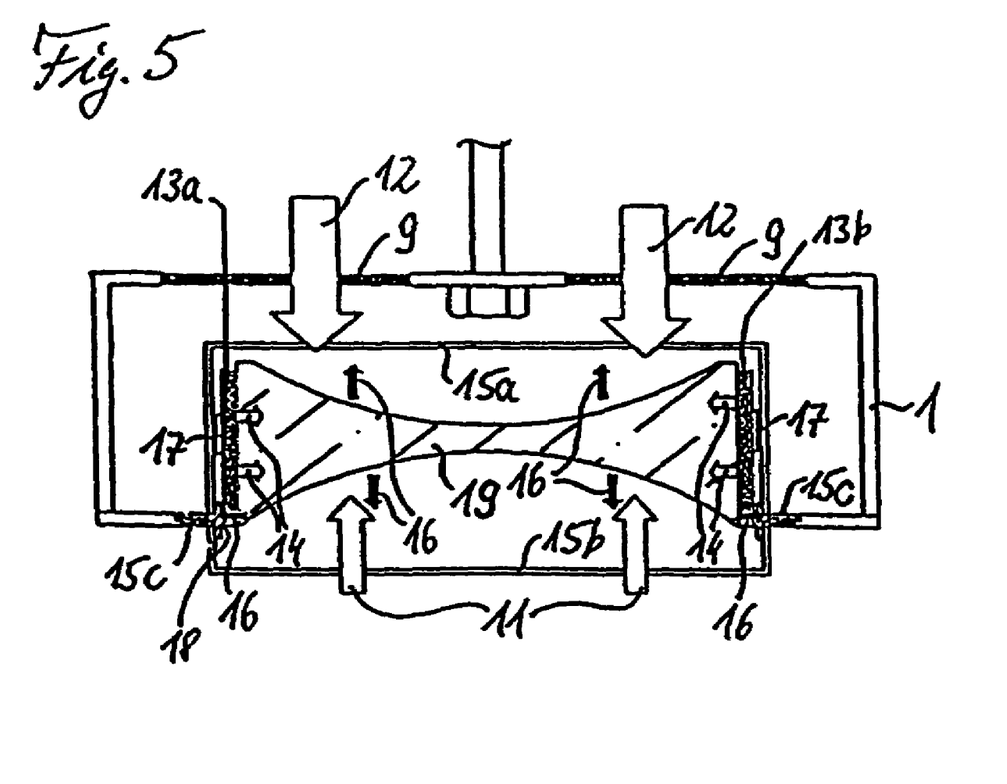
FIG. 5 a section through another embodiment of a substrate carrier in accordance with the invention equipped with a heat-conducting element and a heat-transfer barrier for the case of coating a flint-glass-lens substrate.

In order to further improve substrate heating performance, if demanded by the particular application involved, a heat-conducting element may be employed having a high thermal conductivity and a high absorptance over the spectral-emission range of the heating elements 5, 6 that absorbs thermal radiation emitted by the heating elements 5, 6 and transfers the absorbed thermal energy to the respective substrate via heat conduction through contact surfaces that are as large as feasible. These contact surfaces, which serve as heat-transfer surfaces, are chosen such that temperature gradients within the substrate to be heated will be maintained as small as possible and damage to substrate surfaces, which, in the case of optical components, will, in particular, be damage to their optical surfaces, will be avoided. FIG. 5 depicts an example of such an application, where a flint-glass lens 19 represents the respective substrate to be coated in a coating system in accordance with FIG. 1.

As may be seen from FIG. 5, the cylindrical lateral surface, or circumferential surface, of the flint-glass lens 19, which is held in place by the substrate carrier 1, is elastically contacted by a two-piece heat-conducting element consisting of a pair of half-shells 13a, 13b that are pressed against the circumferential surface of the lens 19 by a circular spring 17. These half-shells 13a, 13b are fabricated from a material, such as aluminum, that has a high thermal conductivity and absorb thermal radiation from the front-side and backside heaters in order to transfer the additional absorbed thermal energy 14 to the body of the lens 19, which is also heated by thermal radiation 11 from the front-side heater and thermal radiation 12 from the backside heater, via thermal contact from its circumferential surface over a large surface area. This heat-conducting element could also consist of more than two components.

In the case of the example depicted in FIG. 5, the heat-conducting element 13a, 13b is clamped onto the substrate 19 by the circular spring 17, where the heat-conducting element 13a, 13b is preferably in thermal contact with the evaporation ring 18, since the latter's front surface faces the front-side heater and is able to absorb thermal energy emanating from that heater. Good thermal contact between the heat-conducting element 13a, 13b and the substrate 19 and ability to absorb heating thermal energy are important, where as little thermal contact as possible with the substrate carrier 1 on the planet carrier will be beneficial. Mounting the heat-conducting element 13a, 13b directly on the substrate 19 such that it is thermally insulated therefrom and maintaining a distance between it and the substrate holder 1 will contribute to realizing that aim.

The additional heat transfer via the thermally conductive half-shells 13a, 13b around the perimeter of the lens contributes to a highly uniform heating of the lens, which prevents a thicker, compared to the central section of the lens, circumferential portion from remaining much cooler than the lens volume in the center portion of the lens. In other words, employing a heat-conducting element will be beneficial whenever the direct thermal radiation 11, 12 from the combined front-side and backside heaters would leave a cooler section of the substrate, against which the heat-conducting element is abutted in order to provide for nearly uniform heating of that section of the substrate as well. In particular, employment of such a heat-conducting element, which preferably should be elastically pressed against the substrate, during coating of concave lenses and other lenses that have relatively large portions of their volumes situated near their cylindrical circumferential surfaces will be beneficial.

The elastic clamping force, which can be adjusted using the circular spring 17, provides for reliable direct thermal contact between the heat-conducting element and the circumferential surface of the relatively voluminous $CaF_2$-lens substrate 19 over a large surface area, where the arrangement employed has been chosen such that the effective clamping force remains essentially constant over the entire temperature range involved.

FIG. 5 also illustrates employment of a heat-transfer barrier during cooling of the flint-glass substrate 19 following a heating cycle. This heat-transfer barrier includes an upper ceramic hood 15a for covering the substrate's backside a lower ceramic hood 15b for covering the substrate's front side, and a ceramic ring 15c that serves as a heat seal between the pair of hoods 15a, 15b. The substrate 19 is thus enclosed on all side by the heat-transfer barrier during cooling in order that heat dissipation 16 from the substrate 19, which is indicated by the heavy black arrows appearing in FIG. 5, will be sufficiently low and may be kept highly uniform, which will prevent undesirable, large, temperature gradients in the substrate 19 from occurring as it cools down.

The ceramic material employed here should preferably have a thermal conductivity no greater than that of the substrate material, e.g., no greater than that of $CaF_2$. These ceramic hoods 15a, 15b may optionally have an IR-reflecting coating, e.g., a gold coating, on their inner surfaces.

It should be obvious that the heat-transfer barrier that has been implemented in this manner should only be in its functional position shown in FIG. 5, in which its components 15a, 15b, 15c fully enclose the substrate 19, during the respective cooling cycle. Both ceramic hoods 15a, 15b are removed during coating and heating cycles in order that irradiation of the front side and backside of the substrate 19 with thermal radiation will not be blocked. Once coating and heating procedures and the usual venting of the coating system have been concluded, the lower hood 15b is installed first, which will shield the substrate 19 from drafts, through the substrate carrier 1 on the planet carrier. The entire substrate-holder assembly is then removed, whereafter the upper hood 15a is installed. Once that operation has been concluded, the entire substrate-holder assembly, complete with substrates and hoods, may be removed from the coating system. The hoods 15a, 15b are mounted by, e.g., plug-type or bayonet mounts.

On coating systems according to FIG. 1, whose substrate carriers according to FIG. 5 are equipped with the heat-conducting element 13a, 13b, substrate heating may beneficially be performed in a regulated, i.e. closed-loop controlled manner employing the method to be described below. The heating current serves as the manipulated variable for the regulating heating by the front-side and backside heaters 5, 6. The regulated variable is the actual temperature of the substrate or substrates, which is measured by the pyrometer 7, i.e., the heating current is adjusted in accordance with the difference between this measured temperature and a prescribable, desired, temperature. The heating current, and thus the heating power, will thereby be adjusted to suit the specific implementations of the front-side heater 5 and backside heater 6 and their placements relative to the substrate or substrates and be split between the front-side heater 5 and backside heater 6 such that they yield identical heat-transfer rates to both sides of each substrate, as illustrated for the case of the example depicted in FIG. 4 and explained above. A conventional regulator unit (not shown) that preferably incorporates a PID-regulator is employed for regulating the heating. The regulator unit also incorporates a limiter for limiting heating current.

That limiter is designed such that it provides that a temperature of the heat-conducting element 13a, 13b and/or the evaporation ring 18 functioning as substrate-carrier fixture measured by a conventional thermocouple (not shown) will not exceed a maximum temperature that has been chosen such that it exceeds the substrate temperature measured by the pyrometer 7 by a prescribable temperature difference. This limitation prevents large mechanical stresses due to the large coefficient of thermal expansion of $CaF_2$ from occurring within $CaF_2$-substrates. This limitation of heating power precludes any danger that the substrate support portion in the vicinity of the heat-conducting element 13a, 13b or evaporation ring 18, which will heat up much faster than the substrate due to their higher absorptance for short wavelength radiation, will heat up too fast and that amplified mechanical stresses will thus occur in this portion.

In the case of an alternative substrate-heating method in accordance with the invention, a regulation of heating power controlled by a selectable, preset, off-set value between the, e.g., pyrometrically measured substrate temperature and the temperature of the associated heat-conducting element or substrate-carrier fixture detected e.g. by a thermocouple, is provided. This regulation of heating power at a preset, desired, temperature offset value is superimposed on the regulation of substrate temperature at a preset, desired, temperature, as described above in conjunction with the first embodiment of a substrate-heating method. In other words, heating current is regulated depending on both the difference between the actual substrate temperature and the preset, desired, substrate temperature and the difference between the actual offset value and the preset, desired, offset value between the substrate temperature and the temperature of the associated heat-conducting element or substrate-carrier fixture. Consequentially, under this variation on the method, the regulation internally provides that no overly large differences between the temperatures of the substrate and the associated heat-conducting element or substrate-carrier fixture will occur. The behavior of the regulation in relation to this temperature difference may be adapted to suit a PID-regulation circuit, where the manner of proceeding described effectively represents a two-point regulation. In the case of a practical implementation, this superimposed regulation may, for example, be additive, i.e., a regulation of heating current based on the difference between the sum of the desired offset value and the desired substrate temperature and the sum of the actual offset value and the actual substrate temperature.

It would be evident to one of ordinary skill after reviewing the present disclosure that other, modified, variations on the heating method are feasible if needed, with which undesirably high differences in the temperatures of the substrate and components that are in contact with it during coating, and thus undesirably high thermal stressing of the substrate material may be prevented, in particular, if needed to suit the shapes and materials of the substrates to be coated.

The aforementioned sample embodiments make it clear that the invention allows very gently and uniformly heating substrates to be coated at the locations where they are to be coated, and during coating. In particular, the backside heater that is arranged a relatively short distance away from each substrate and actively heats the backsides of substrates and is preferably supported by an auxiliary front-side heater contributes to that gentle, uniform, heating. Additional heat transfer via thermal contact of the surfaces of the respective substrates with those of heat-conducting elements is provided, particularly in the case of voluminous substrates. The heating power can be controlled such that no overly large differences between the temperatures of heat-conducting elements or substrate-carrier fixtures and those of substrates will occur. In order that substrate cooling will also take place sufficiently gently, each substrate may be enclosed within a heat-transfer barrier, if necessary.

It should be clear that implementations of the invention other than those described above, in particular, implementations for conventional types of coating systems other than the aforementioned planetary-drive type, and/or for coating $CaF_2$-substrates other than those for the aforementioned optical components, or for coating arbitrary types of substrates fabricated from some other material, are feasible. In every case, the characteristic feature is the arrangement of a backside heater a relatively short distance away from substrates, accompanied by providing that their associated substrate carriers will be transparent to IR-radiation over at least portions of their surfaces, as depicted in FIG. 2, if necessary. Instead of using a pyrometer, substrate temperatures might also be measured by any other conventional means, in which case, a closed heat-radiator ring, rather than the open heat-radiator ring of FIG. 1, could be employed for heating the backsides of substrates carried on a planetary-drive system, if necessary.

The above description of the preferred embodiments has been given by way of example. From the disclosure given, those skilled in the art will not only understand the present invention and its attendant advantages, but will also find apparent various changes and modifications to the structures and methods disclosed, e.g. as indicated above. It is sought, therefore, to cover all such changes and modifications as fall within the spirit and scope of the invention, as defined by the appended claims, and equivalents thereof.

What is claimed is:

1. A substrate-coating system, comprising:
   a substrate holder for holding at least one substrate at a coating position for coating the substrate on a coating side; and
   a substrate heater;
   wherein the substrate heater comprises a backside heater for actively heating the substrate from a backside opposite the coating side thereof, while the substrate is at the coating position;
   wherein:
      the substrate holder comprises at least one substrate carrier that is transparent to the thermal radiation emitted by the backside heater over at least portions thereof, and
      the backside heater has at least one heating element arranged on that side of the substrate holder opposite the substrate to be coated;
   wherein every heating element is an IR thermal radiator, and at least one window area that is at least partially transparent to the thermal radiation emitted by the IR thermal radiator and incorporates a window layer of at least one of a Ge-material, ZnSe-material, ZnS-material or Si-material, is incorporated into the associated substrate carrier; and
   wherein the window layer is anti-reflection coated for an IR wavelength range below 20 µm on at least one side thereof.

2. A substrate-coating system according to claim 1, configured for coating $CaF_2$-substrates.

3. A substrate-coating system according to claim 1, wherein the substrate heater further comprises a front-side heater.

4. A substrate-coating system according to claim 1, further comprising heat-conducting elements that laterally abut against associated ones of the substrates.

5. A substrate-coating system according to claim 4, wherein the heat-conducting elements form part of the substrate holder.

6. A substrate-coating system according to claim 4, further comprising elements that elastically press the heat-conducting elements respectively against the substrates.

7. A substrate-coating system according to claim 1, wherein the window layer is anti-reflection coated for an IR wavelength range from approximately 10 µm to approximately 12 µm.

8. A substrate-coating system according to claim 1, further comprising heat-transfer barriers which respectively enclose associated ones of the substrates as a hood during respective cooling-down periods.

9. A substrate-coating system according to claim 1, wherein the backside heater is a closed backside heat-radiator ring.

10. A substrate-coating system according to claim 1, wherein the backside heater is an open backside heat radiator ring.

11. A substrate-coating system according to claim 10, wherein the open backside heat-radiator ring has a pyrometer for detecting substrate temperature arranged within a ring gap of the radiator ring.

* * * * *